(12) United States Patent
Matsuo et al.

(10) Patent No.: US 9,695,512 B2
(45) Date of Patent: Jul. 4, 2017

(54) SEMICONDUCTOR MANUFACTURING SYSTEM AND SEMICONDUCTOR MANUFACTURING METHOD

(71) Applicant: KABUSHIKI KAISHA TOSHIBA, Minato-ku (JP)

(72) Inventors: Kazuhiro Matsuo, Yokkaichi (JP); Fumiki Aiso, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 98 days.

(21) Appl. No.: 14/614,574

(22) Filed: Feb. 5, 2015

(65) Prior Publication Data

US 2016/0060762 A1   Mar. 3, 2016

Related U.S. Application Data (60) Provisional application No. 62/044,535, filed on Sep. 2, 2014.

(51) Int. Cl.
| | |
|---|---|
| *C23C 16/52* | (2006.01) |
| *H01L 21/66* | (2006.01) |
| *H01L 21/02* | (2006.01) |
| *C23C 16/455* | (2006.01) |
| *C23C 16/44* | (2006.01) |

(52) U.S. Cl.
CPC .......... *C23C 16/52* (2013.01); *C23C 16/4412* (2013.01); *C23C 16/45544* (2013.01); *H01L 21/0228* (2013.01); *H01L 21/02164* (2013.01)

(58) Field of Classification Search
CPC ........................ C23C 16/52; C23C 16/45544
See application file for complete search history.

(56) References Cited

U.S. PATENT DOCUMENTS

| | | | |
|---|---|---|---|
| 2006/0225651 A1 | 10/2006 | Ueno et al. | |
| 2011/0017135 A1* | 1/2011 | Murata | C23C 16/45544 |
| | | | 118/665 |
| 2012/0295449 A1* | 11/2012 | Fukazawa | C23C 16/30 |
| | | | 438/786 |

FOREIGN PATENT DOCUMENTS

| | | |
|---|---|---|
| JP | 5-315421 | 11/1993 |
| JP | 2006-228990 | 8/2006 |
| JP | 2014-17438 | 1/2014 |

* cited by examiner

*Primary Examiner* — Kimberly Rizkallah
*Assistant Examiner* — Mounir Amer
(74) *Attorney, Agent, or Firm* — Oblon, McClelland, Maier & Neustadt, L.L.P.

(57) ABSTRACT

In one embodiment, a semiconductor manufacturing system includes a film forming apparatus configured to form a film on a surface of a wafer. The system further includes a gas supply module configured to supply at least a type of source gas for the film into the film forming apparatus. The system further includes a measurement module configured to measure a discharge amount of an exhaust gas from the film forming apparatus. The system further includes a controller configured to calculate a value corresponding to a surface area of the wafer based on the discharge amount of the exhaust gas from the film forming apparatus, and to control a supply amount of the source gas to the film forming apparatus based on the value corresponding to the surface area of the wafer.

13 Claims, 8 Drawing Sheets

SEMICONDUCTOR MANUFACTURING SYSTEM AND SEMICONDUCTOR MANUFACTURING METHOD

CROSS REFERENCE TO RELATED APPLICATION

This application is based upon and claims the benefit of priority from the prior U.S. Provisional Patent Application No. 62/044,535 filed on Sep. 2, 2014, the entire contents of which are incorporated herein by reference.

FIELD

Embodiments described herein relate to a semiconductor manufacturing system and a semiconductor manufacturing method.

BACKGROUND

When a film such as an atomic layer deposition (ALD) film is formed on a surface of a wafer, there is a problem of a supply amount of a source gas supplied to a film forming apparatus. When the supply amount of the source gas is too small, the source gas for uniformly forming the film becomes insufficient, so that the uniformity of the film is deteriorated. On the other hand, when the supply amount of the source gas is too large, an unnecessary source gas that does not contribute to the formation of the film is wastefully discharged. In addition, when the supply amount of the source gas is too large, a pipe located downstream of the film forming apparatus is often clogged with by-products, resulting in that a maintenance period of a semiconductor manufacturing system becomes short. Also, the supply amount of the source gas needed for forming the film varies depending on a surface area of the wafer. Accordingly, in the case where the supply amount of the source gas is constant, the source gas can be excessive when the wafer surface is flat, and the source gas can be insufficient when the wafer surface has irregularities.

DETAILED DESCRIPTION

Embodiments will now be explained with reference to the accompanying drawings.

In one embodiment, a semiconductor manufacturing system includes a film forming apparatus configured to form a film on a surface of a wafer. The system further includes a gas supply module configured to supply at least a type of source gas for the film into the film forming apparatus. The system further includes a measurement module configured to measure a discharge amount of an exhaust gas from the film forming apparatus. The system further includes a controller configured to calculate a value corresponding to a surface area of the wafer based on the discharge amount of the exhaust gas from the film forming apparatus, and to control a supply amount of the source gas to the film forming apparatus based on the value corresponding to the surface area of the wafer.

First Embodiment

Figure 1:
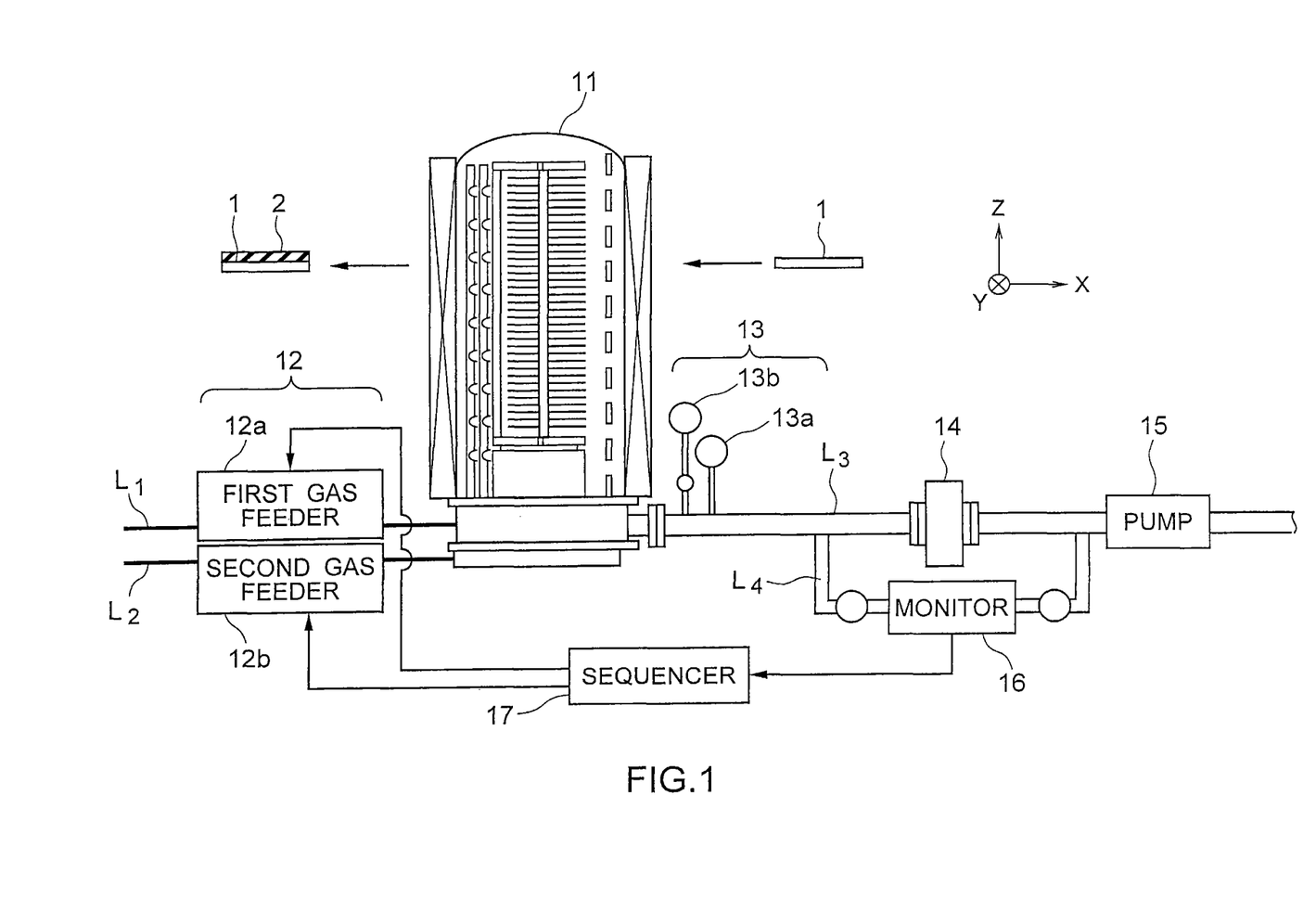
FIG. 1 is a schematic diagram illustrating a configuration of a semiconductor manufacturing system of a first embodiment.

FIG. 1 is a schematic diagram illustrating a configuration of a semiconductor manufacturing system of a first embodiment.

The semiconductor manufacturing system in FIG. 1 includes an ALD apparatus 11 as an example of a film forming apparatus, a gas supply module 12, a pressure measuring module 13, a main valve 14, a pump 15, a monitor 16 as an example of a measurement module, and a sequencer 17 as an example of a controller.

[ALD Apparatus 11]

The ALD apparatus 11 forms a deposition film 2 on a surface of a wafer 1 by ALD. Examples of the wafer 1 include a semiconductor substrate, and a workpiece substrate including a semiconductor substrate and a workpiece layer. Examples of the deposition film 2 include an oxide film and a nitride film. The deposition film 2 is an example of a film in the disclosure. FIG. 1 schematically illustrates a state in which the wafer 1 is carried in the ALD apparatus 11, and extracted from the ALD apparatus 11 after the formation of the deposition film 2. The ALD apparatus 11 can store plural wafers.

FIG. 1 illustrates an X direction and a Y direction which are parallel to the surface of the wafer 1 and perpendicular to each other, and a Z direction which is perpendicular to the surface of the wafer 1. In the present specification, the +Z direction is defined as an upper direction, and the −Z direction is defined as a lower direction. For example, the positional relationship between the wafer 1 and the deposition film 2 is expressed such that the wafer 1 is located at the side of the lower surface of the deposition film 2. The −Z direction in FIG. 1 may be the same as the direction of gravity, or may be different from the direction of gravity.

[Gas Supply Module 12]

The gas supply module 12 is provided upstream of the ALD apparatus 11 for supplying at least a type of source gas for the deposition film 2 into the ALD apparatus 11. The gas supply module 12 includes a first gas feeder 12a for supplying a first source gas adsorbed on the surface of the wafer 1, and a second gas feeder 12b for supplying a second source gas that reacts with the first source gas to form the deposition film 2.

When the deposition film 2 is a silicon oxide film, an example of the first source gas is a precursor such as hexachlorodisilane (HCD) or an aminosilane-based gas, and an example of the second source gas is an oxidant such as oxygen or ozone. The first and second source gases are respectively supplied to the ALD apparatus 11 via pipes $L_1$ and $L_2$.

[Pressure Measuring Module 13]

The pressure measuring module 13 is disposed on a pipe $L_3$ downstream of the ALD apparatus 11 for measuring a pressure of an exhaust gas from the ALD apparatus 11. The pressure measuring module 13 includes a first pressure gauge 13a that can measure a pressure in a wide range such as atmospheric pressure, and a second pressure gauge 13b that can measure a pressure in nearly a vacuum environment with high accuracy.

[Main Valve 14]

The main valve 14 is disposed on the pipe $L_3$ downstream of the ALD apparatus 11 for controlling distribution and a flow rate of the exhaust gas from the ALD apparatus 11. The main valve 14 is disposed at the downstream side from the pressure measuring module 13 and at the upstream side from the pump 15. The pipe $L_3$ is connected to a pipe $L_4$ at the portion between the pressure measuring module 13 and the main valve 14 and at the portion between the main valve 14 and the pump 15. The semiconductor manufacturing system of the present embodiment can control a pressure in the ALD apparatus 11 by adjusting an opening degree of the main valve 14.

[Pump 15]

The pump 15 is disposed on the pipe $L_3$ downstream of the ALD apparatus 11, and operates to discharge an exhaust gas from the ALD apparatus 11. The pump 15 is disposed at the downstream side from the main valve 14.

[Monitor 16]

The monitor 16 is disposed on the pipe $L_4$ for measuring a discharge amount of the exhaust gas from the ALD apparatus 11. The monitor 16 measures, as the discharge amount of the exhaust gas, a discharge amount of the first source gas, a discharge amount of the second source gas, or a discharge amount of a gas generated by the reaction between the first and second source gases, for example. The monitor 16 outputs the measurement result of the discharge amount of the exhaust gas to the sequencer 17.

A spectral photometer and a mass spectrometer are examples of the monitor 16. When the former is used, the monitor 16 can measure a concentration or discharge amount of a predetermined substance in the exhaust gas by measuring a wavelength or an intensity of light from the exhaust gas. When the latter is used, the monitor 16 can measure a concentration or discharge amount of a predetermined substance in the exhaust gas by measuring a mass or a number of particles in the exhaust gas.

Examples of the spectral photometer include a Fourier transform infrared spectrometer (FT-IR) and a non-dispersive infrared spectrometer (ND-IR). The FT-IR is used for example in the case where a value of a wavelength to be measured is unknown. The ND-IR is used for example in the case where a value of a wavelength to be measured is known.

The monitor 16 in the present embodiment monitors light from the exhaust gas or particles in the exhaust gas to measure the discharge amount of the exhaust gas from the ALD apparatus during the formation of the deposition film 2 (in-situ monitoring). Specifically, the monitor 16 of the present embodiment measures the discharge amount of the exhaust gas from the ALD apparatus 11 during the supply of the source gas to the ALD apparatus 11. Details of such a measuring process will be described later.

[Sequencer 17]

The sequencer 17 controls various operations of the semiconductor manufacturing system illustrated in FIG. 1. For example, the sequencer 17 controls the operations of the ALD apparatus 11, the gas supply module 12, the pressure measuring module 13, the main valve 14, the pump 15 and the monitor 16. The sequencer 17 can also receive the pressure of the exhaust gas from the pressure measuring module 13 or receive the discharge amount of the exhaust gas from the monitor 16.

When receiving the discharge amount of the exhaust gas from the monitor 16, the sequencer 17 calculates a relative surface area of the wafer 1 based on the discharge amount of the exhaust gas. The relative surface area of the wafer 1 is a value obtained by dividing the surface area S of the wafer 1 by a surface area $S_0$ of a wafer 1 whose surface is flat (see FIGS. 2A to 3B). The relative surface area $S/S_0$ of the wafer 1 is an example of a value corresponding to the surface area S of the wafer 1. The sequencer 17 may calculate the surface area S itself, in place of the relative surface area $S/S_0$ of the wafer 1. Details of the surface areas S and $S_0$ and the relative surface area $S/S_0$ will be described later.

The sequencer 17 then controls a supply amount of the source gas to the ALD apparatus 11, based on the relative surface area of the wafer 1. Specifically, the sequencer 17 controls supply amounts of the first and second source gases to the ALD apparatus 11, based on the relative surface area of the wafer 1. Details of such control will be described later.

The surface areas S and $S_0$ and the relative surface area $S/S_0$ of the wafer 1 will be described with reference to FIGS. 2A to 3B.

Figure 2A:
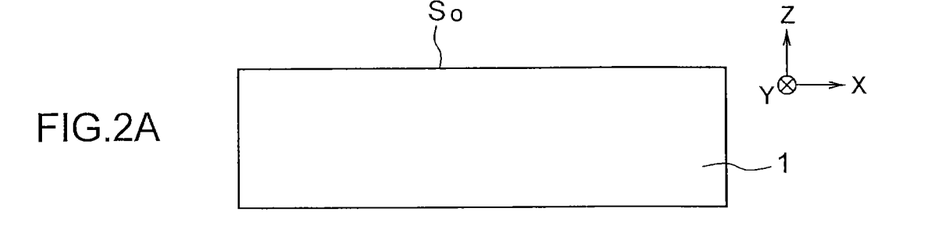
FIGS. 2A and 2B are sectional views illustrating a deposition process for forming a deposition film on a wafer having a flat surface.
Figure 2B:
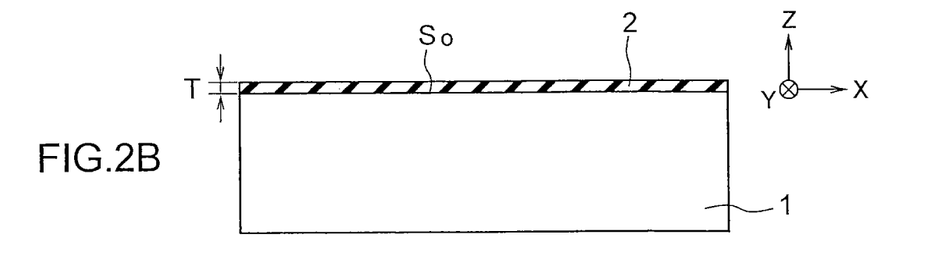

FIGS. 2A and 2B are sectional views illustrating a deposition process for forming the deposition film 2 on the wafer 1 having a flat surface.

FIG. 2A illustrates the wafer 1 with the flat surface. In this case, the surface area $S_0$ of the wafer 1 is represented by $\pi r^2$, when the radius of the wafer 1 is defined as r. FIG. 2B illustrates the deposition film 2 formed on the surface of this wafer 1. A reference sign T indicates a thickness of the deposition film 2.

Figure 3A:
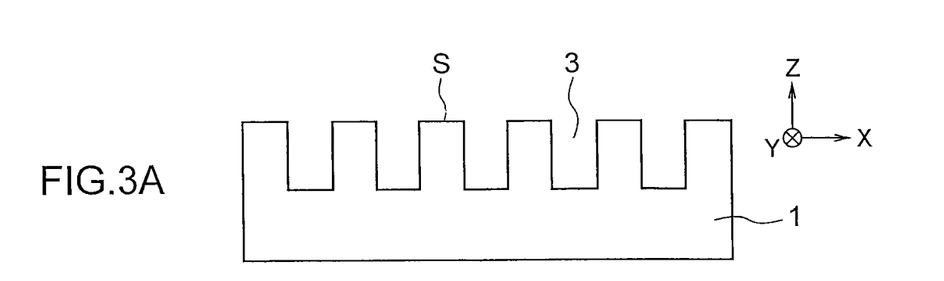
FIGS. 3A and 3B are sectional views illustrating a deposition process for forming the deposition film on the wafer having an irregular surface.
Figure 3B:
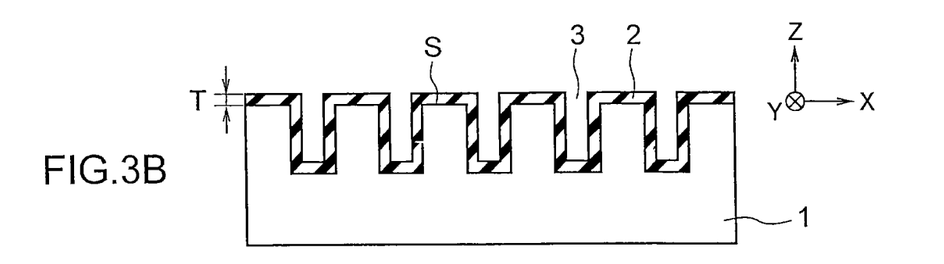

FIGS. 3A and 3B are sectional views illustrating a deposition process for forming the deposition film 2 on the wafer 1 having an irregular surface.

FIG. 3A illustrates the wafer 1 with the irregular surface. The wafer 1 illustrated in FIG. 3A has plural concave portions 3 on its surface. In this case, the surface area S of the wafer 1 is larger than the above surface area $S_0$, and the relative surface area $S/S_0$ of this wafer 1 is larger than 1. FIG. 3B illustrates the deposition film 2 formed on the surface of this wafer 1. Similar to the deposition film 2 in FIG. 2B, the deposition film 2 in FIG. 3B has a thickness T.

In the case of FIG. 3B, the supply amount of the source gas needed for forming the deposition film 2 varies according to the relative surface area $S/S_0$ of the wafer 1. Therefore, the semiconductor manufacturing system of the present embodiment controls the supply amount of the source gas to the ALD apparatus 11, based on the relative surface area $S/S_0$ of the wafer 1 for preventing a lack of the source gas and a loss of the source gas.

Figure 4A:
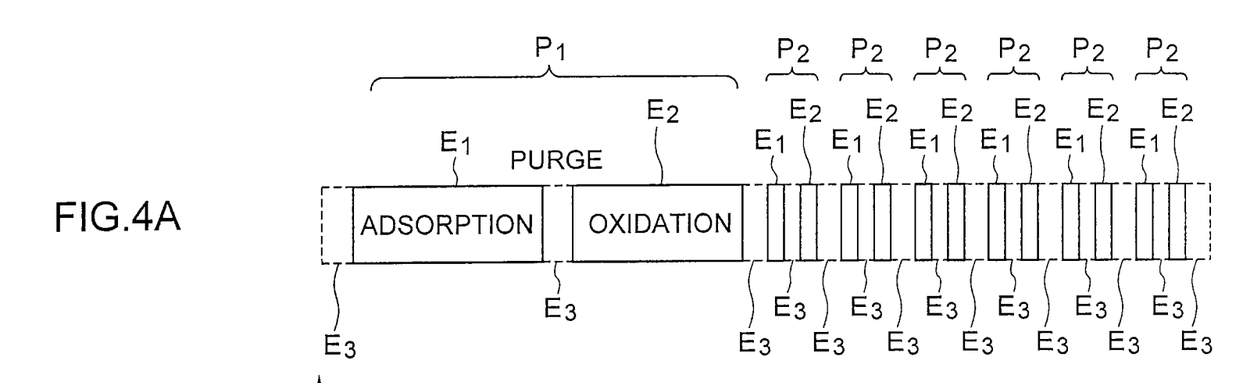
FIGS. 4A and 4B are graphs for describing an operation of the semiconductor manufacturing system of the first embodiment.
Figure 4B:
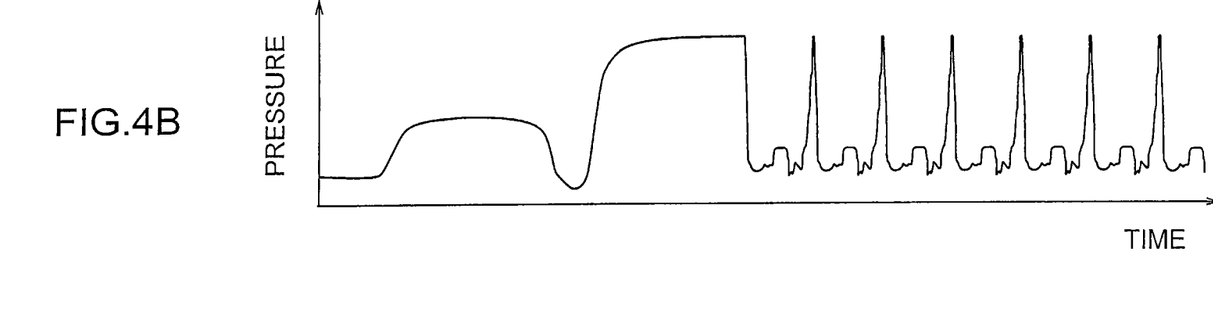

FIGS. 4A and 4B are graphs for describing an operation of the semiconductor manufacturing system of the first embodiment.

The semiconductor manufacturing system of the present embodiment alternately executes adsorption processes $E_1$ for adsorbing the first source gas supplied into the ALD apparatus 11 onto the surface of the wafer 1 and reaction processes $E_2$ for allowing the second source gas supplied into the ALD apparatus 11 to react with the first source gas, in order to form the deposition film 2 (FIG. 4A). The semiconductor manufacturing system of the present embodiment also executes purge processes $E_3$ for evacuating the ALD apparatus 11 to clean the inside of the ALD apparatus 11 between the adsorption processes $E_1$ and the reaction processes $E_2$ (FIG. 4A). For example, the first and second source gases are a precursor and an oxidant, respectively. The reaction processes $E_2$ in FIG. 4A correspond to oxidation processes.

FIG. 4B illustrates the pressure in the ALD apparatus 11 during the adsorption processes $E_1$, the reaction processes $E_2$, and the purge processes $E_3$. It is understood that the pressure increases during the adsorption processes $E_1$ and the reaction processes $E_2$, while the pressure decreases during the purge processes $E_3$.

Figure 5:
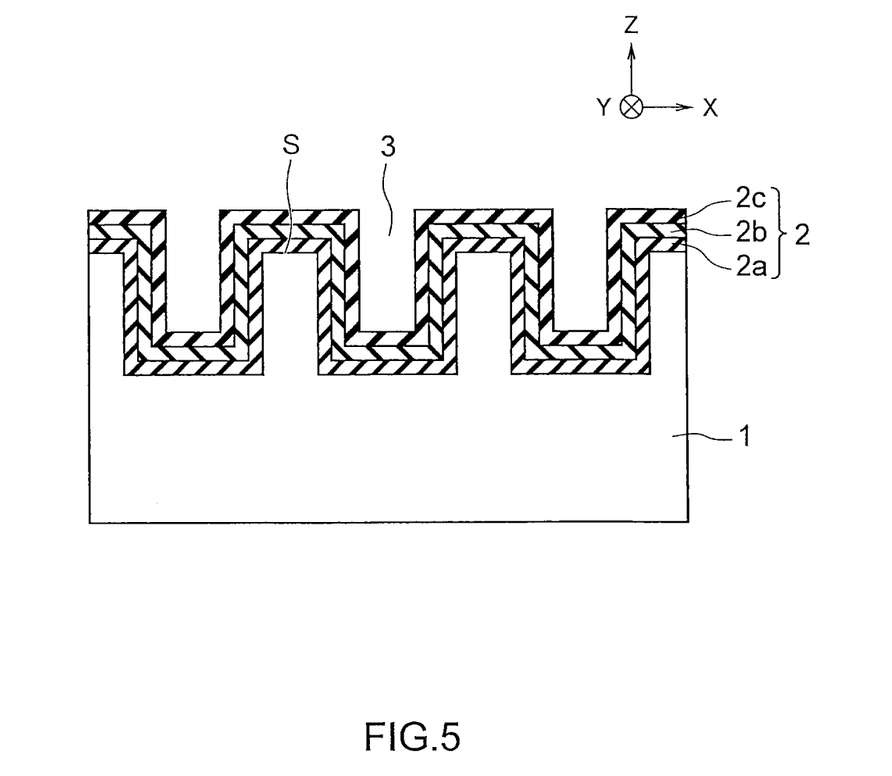
FIG. 5 is a sectional view for describing a process of forming the deposition film of the first embodiment.

FIG. 5 is a sectional view for describing a process of forming the deposition film 2 of the first embodiment.

The deposition film 2 of the present embodiment is formed by ALD. Therefore, in the present embodiment, a layer of the deposition film 2 is formed by executing an adsorption process $E_1$ and a reaction process $E_2$. FIG. 5 illustrates the deposition film 2 having three layers 2a to 2c. The deposition film 2 in FIG. 5 is formed by alternately executing three adsorption processes $E_1$ and three reaction processes $E_2$.

The operation of the semiconductor manufacturing system of the first embodiment will continuously be described with again reference to FIGS. 4A and 4B.

FIG. 4A illustrates one first period $P_1$, and plural second periods $P_2$ which follows the first period $P_1$ and are shorter than the first period $P_1$.

The first period $P_1$ includes one adsorption process $E_1$, one reaction process $E_2$, and one purge process $E_3$ between the adsorption process $E_1$ and the reaction process $E_2$. The semiconductor manufacturing system of the present embodiment forms one layer included in the deposition film 2 in the first period $P_1$. The layer 2a in FIG. 5 is an example of such layer.

Similarly, each second period $P_2$ includes one adsorption process $E_1$, one reaction process $E_2$, and one purge process $E_3$ between the adsorption process $E_1$ and the reaction process $E_2$. The semiconductor manufacturing system of the present embodiment forms each layer included in the deposition film 2 in each second period $P_2$. The layers 2b and 2c in FIG. 5 are examples of such layer.

The manufacturing system of the present embodiment forms one layer in the deposition film 2 during the first period $P_1$, and forms each layer in the deposition film 2 during each second period $P_2$, thereby forming the deposition film 2 including plural layers. In the present embodiment, the layer formed during the first period $P_1$ and the layer formed during each second period $P_2$ have the same characteristics, and forms the deposition film 2 having uniform characteristics.

The first period $P_1$ in the present embodiment is used as a test period to form the deposition film 2 with low speed for calculating the relative surface area $S/S_0$ of the wafer 1. The second periods $P_2$ in the present embodiment are used as normal periods to form the deposition film 2 with normal speed based on the relative surface area $S/S_0$ of the wafer 1.

Specifically, the monitor 16 measures the discharge amount of the exhaust gas from the ALD apparatus 11 during the first period $P_1$, and the sequencer 17 calculates the relative surface area $S/S_0$ of the wafer 1 based on the discharge amount of the exhaust gas measured during the first period $P_1$. For example, the monitor 16 measures a discharge amount of a gas generated by the reaction between the first and second source gases. In this case, the discharge amount of this generated gas depends on the adsorption amount of the first source gas adsorbed on the wafer 1, and the adsorption amount of the first source gas depends on the surface area S of the wafer 1. Accordingly, the sequencer 17 can calculate the relative surface area $S/S_0$ of the wafer 1 based on the discharge amount of the generated gas.

In the case where plural types of gases are generated by the above reaction, the monitor 16 may measure a discharge amount of a specific generated gas, or may measure discharge amounts of all generated gases. When plural types of gases are generated, a window of the FT-IR (monitor 16) might be fogged with any one of the gases to deteriorate measuring sensitivity of the FT-IR. In this case, the FT-IR measures only a wavelength in a predetermined region of light from the exhaust gas, i.e., measures the discharge amount of only a specific generated gas, thereby enabling measurement of the discharge amount of the exhaust gas with suppressing the fogging of the window.

The monitor 16 may measure the discharge amount of the first source gas included in the exhaust gas during the first period $P_1$. In this case, the difference between the supply amount of the first source gas and the discharge amount of the first source gas corresponds to the adsorption amount of the first source gas adsorbed on the wafer 1. Therefore, the sequencer 17 can calculate the adsorption amount of the first source gas based on the discharge amount of the first source gas, and can calculate the relative surface area $S/S_0$ of the wafer 1 based on the adsorption amount of the first source gas. The same applies to the case where the monitor 16 measures the discharge amount of the second source gas included in the exhaust gas.

In a case where the discharge amount of the first source gas is measured, the monitor 16 in the present embodiment measures the discharge amount of the first source gas from a supply start to a supply stop of the first source gas to the ALD apparatus 11 during the first period $P_1$, for example. In a case where the discharge amount of the second source gas is measured, the monitor 16 in the present embodiment measures the discharge amount of the second source gas from a supply start to a supply stop of the second source gas to the ALD apparatus 11 during the first period $P_1$, for example. In a case where the discharge amount of the gas generated by the reaction between the first and second source gases is measured, the monitor 16 in the present embodiment measures the discharge amount of this generated gas from the supply start to the supply stop of the second source gas to the ALD apparatus 11 during the first period $P_1$, for example.

The sequencer 17 then controls the supply amounts of the first and second source gases during each second period $P_2$ based on the relative surface area $S/S_0$ of the wafer 1. For example, the sequencer 17 calculates the minimum supply amounts of the first and second source gases necessary for forming one layer in the deposition film 2 based on the relative surface area $S/S_0$ of the wafer 1, and sets the supply amounts of the first and second source gases to the minimum supply amounts or amounts close to the minimum supply amounts during each second period $P_2$. This can prevent a lack or loss of the first and second source gases. The first period $P_1$ in the present embodiment is set longer than each second period $P_2$ for more accurately measuring the discharge amount of the exhaust gas.

After calculating the minimum supply amount of the first source gas, the sequencer 17 of the present embodiment determines the flow rate and supply time of the first source gas from the minimum supply amount of the first source gas. In this case, a product of the flow rate and the supply time is the minimum supply amount. The sequencer 17 controls the supply amount of the first source gas in each second period $P_2$ based on the determined flow rate and the supply time. Similarly, the sequencer 17 of the present embodiment determines the flow rate and supply time of the second source gas from the minimum supply amount of the second source gas, and controls the supply amount of the second source gas in each second period $P_2$ based on the determined flow rate and supply time.

When the first source gas is supplied in each second period $P_2$, the sequencer 17 in the present embodiment controls the supply amount of the first source gas that is supplied from a supply start to a supply stop of the first source gas to the ALD apparatus 11 during each second period $P_2$. When the second source gas is supplied in each second period $P_2$, the sequencer 17 in the present embodiment controls the supply amount of the second source gas that is supplied from a supply start to a supply stop of the second source gas to the ALD apparatus 11 during each second period $P_2$.

First and second examples of the semiconductor manufacturing method executed by the semiconductor manufacturing system of the present embodiment will be described below. These examples correspond to specific examples of the semiconductor manufacturing method illustrated in FIGS. 4A and 4B.

(1) First Example of Semiconductor Manufacturing Method of First Embodiment

Figure 6A:
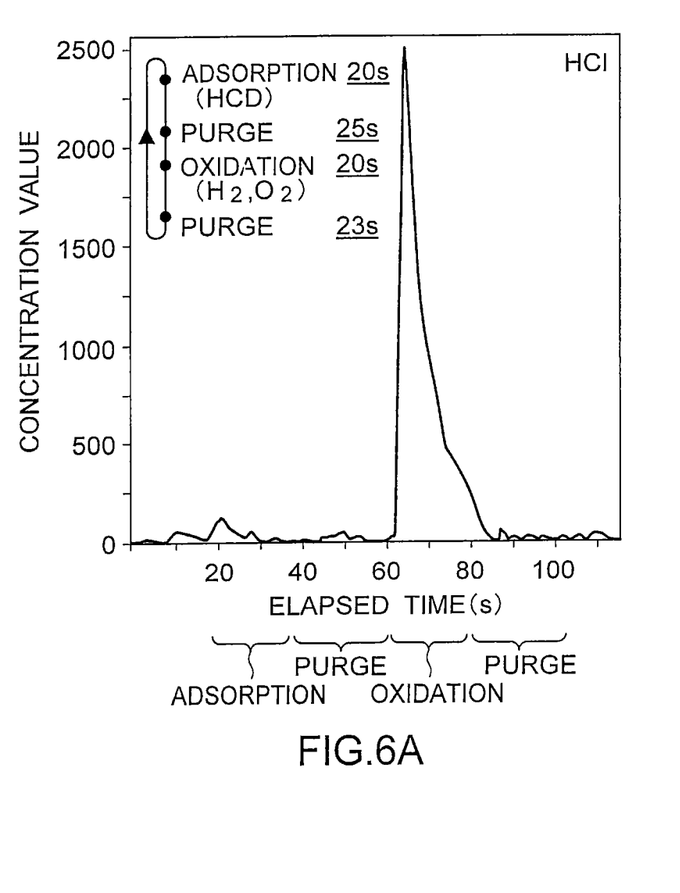
FIGS. 6A and 6B are graphs for describing a first example of the semiconductor manufacturing method of the first embodiment.
Figure 6B:
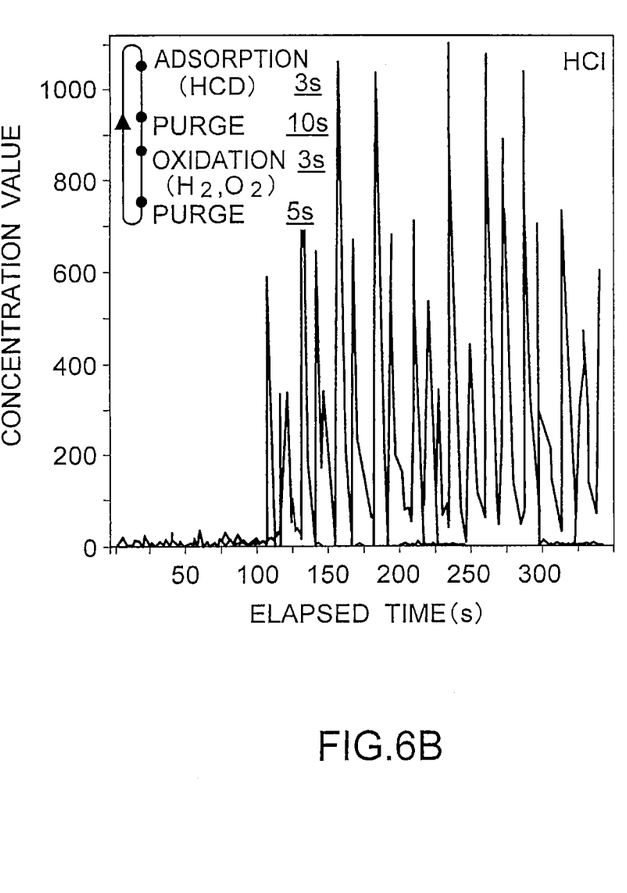

FIGS. 6A and 6B are graphs for describing a first example of the semiconductor manufacturing method of the first embodiment.

The gas supply module 12 in the first example supplies $Si_2Cl_6$ (HCD: hexachlorodisilane) gas as the first source gas, and $O_2$ (oxygen) gas and $H_2$ (hydrogen) gas as the second source gas. As a result, the ALD apparatus 11 forms $SiO_2$ (silicon oxide film) as the deposition film 2, and discharges HCl (hydrogen chloride) gas as an exhaust gas.

FIG. 6A illustrates a concentration of HCl measured by the monitor 16 during the first period $P_1$. FIG. 6B illustrates a concentration of HCl measured by the monitor 16 during the second periods $P_2$. It is understood from FIGS. 6A and 6B that the concentration of HCl increases during the reaction processes (oxidation processes) $E_2$.

The monitor 16 in the first example calculates an area (concentration×time) of the concentration curve of HCl during the reaction process $E_2$ in the graph in FIG. 6A, and calculates the discharge amount of the HCl gas during the first period $P_1$ based on this area. The sequencer 17 calculates the relative surface area $S/S_0$ of the wafer 1 based on the discharge amount of the HCl gas during the first period $P_1$.

(2) Second Example of Semiconductor Manufacturing Method of First Embodiment

Figure 7:
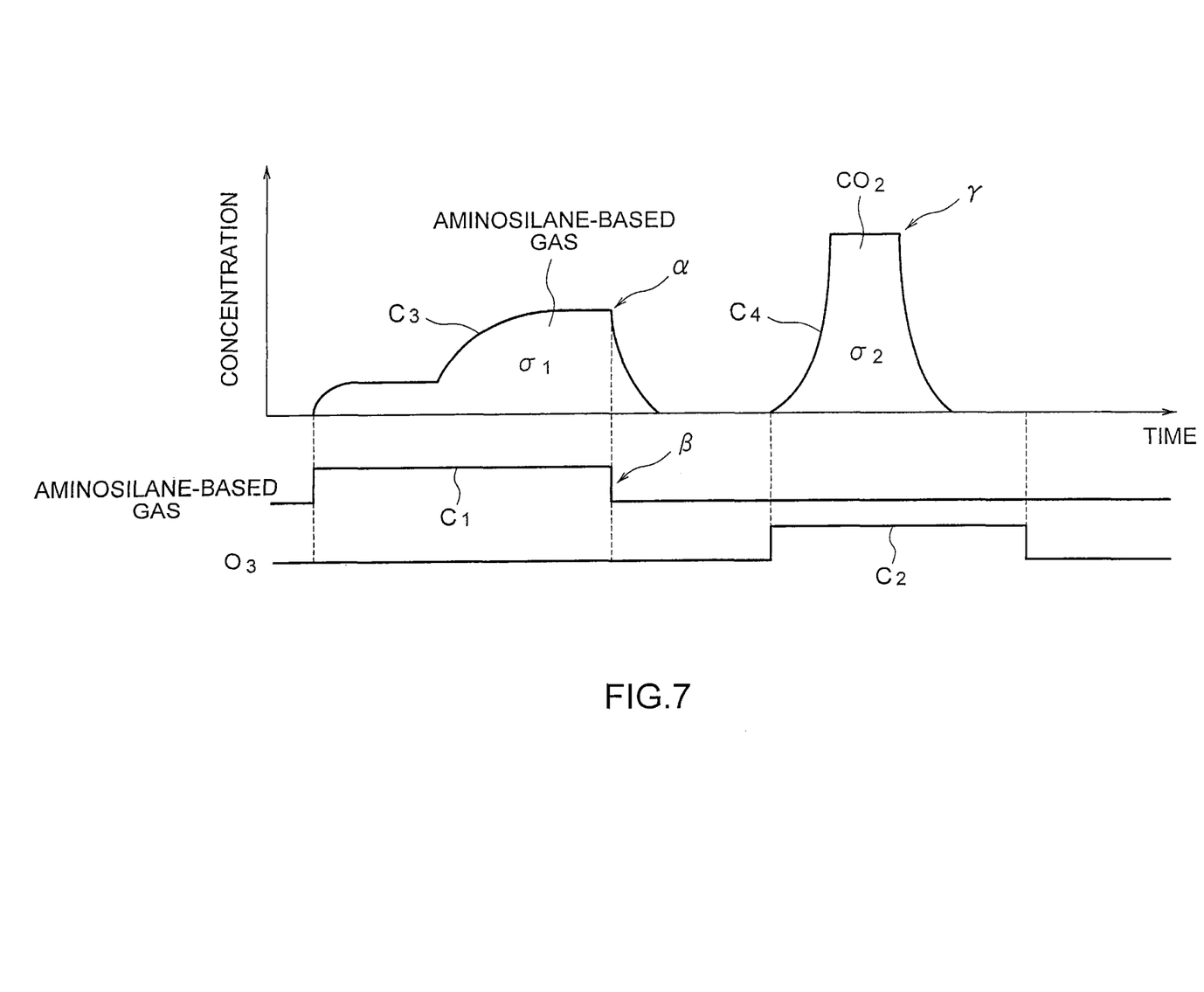
FIG. 7 is a graph for describing a second example of the semiconductor manufacturing method of the first embodiment.
Figure 8:
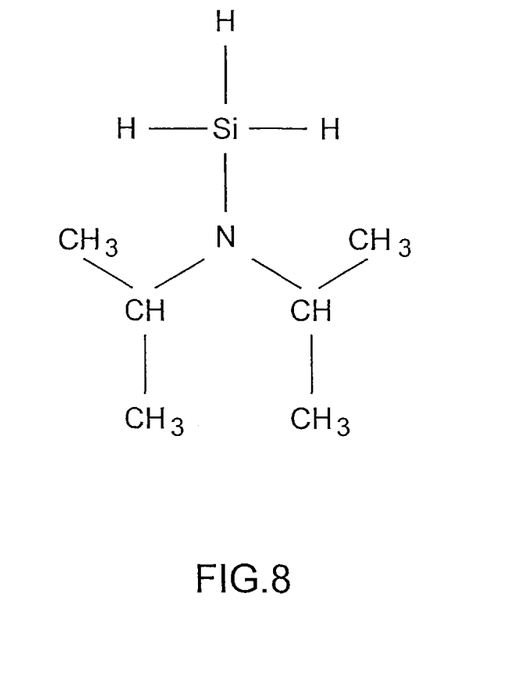
FIG. 8 shows a structural formula of an aminosilane-based gas used in the second example.

FIG. 7 is a graph for describing a second example of the semiconductor manufacturing method of the first embodiment. The gas supply module 12 in the second example supplies aminosilane-based gas as the first source gas, and $O_3$ (ozone) gas as the second source gas. FIG. 8 shows a structural formula of the aminosilane-based gas used in the second example. The aminosilane-based gas in FIG. 8 is obtained by substituting hydrogen of an amino group ($NH_2$) in aminosilane ($SiH_3NH_2$) by an alkyl group. The ALD apparatus 11 in the second example forms $SiO_2$ (silicon oxide film) as the deposition film 2, and discharges $CO_2$ (carbon dioxide) gas and $H_2O$ (water) gas as an exhaust gas.

A curve $C_1$ in FIG. 7 indicates a period in which the aminosilane-based gas is supplied during the first period $P_1$. The adsorption process $E_1$ progresses during the period in which the curve $C_1$ is high. A curve $C_2$ in FIG. 7 indicates a period in which $O_3$ gas is supplied during the first period $P_1$. The reaction process $E_2$ progresses during the period in which the curve $C_2$ is high. A curve $C_3$ indicates a concentration of the aminosilane-based gas measured by the monitor 16 during the first period $P_1$. A curve $C_4$ indicates a concentration of $CO_2$ measured by the monitor 16 during the first period $P_1$.

An arrow α indicates a timing at which the concentration of the aminosilane-based gas is saturated. An arrow β indicates a timing at which the supply of the aminosilane-based gas is stopped. An arrow γ indicates a timing at which the concentration of $CO_2$ starts to decrease. The monitor 16 in the second example measures the concentration of the aminosilane-based gas contained in the exhaust gas during the first period $P_1$. After detecting that the concentration of the aminosilane-based gas is saturated, the monitor 16 notifies the sequencer 17 of this detection result. The sequencer 17 stops the supply of the aminosilane-based gas to the ALD apparatus 11 from the gas supply module 12 in response to this notification.

A reference sign $\sigma_1$ indicates an area of the concentration curve $C_3$ of the aminosilane-based gas. A reference sign $\sigma_2$ indicates an area of the concentration curve $C_4$ of $CO_2$. The monitor 16 in the second example calculates a discharge amount of the aminosilane-based gas or the $CO_2$ gas during the first period $P_1$ based on the area $\sigma_1$ or the area $\sigma_2$. The sequencer 17 then calculates the relative surface area $S/S_0$ of the wafer 1 based on the discharge amount of the aminosilane-based gas or the $CO_2$ gas during the first period $P_1$.

(3) Semiconductor Manufacturing Method of Modification of First Embodiment

A semiconductor manufacturing method of a modification of the first embodiment will be described with reference to FIGS. 9 and 10.

Figure 9:
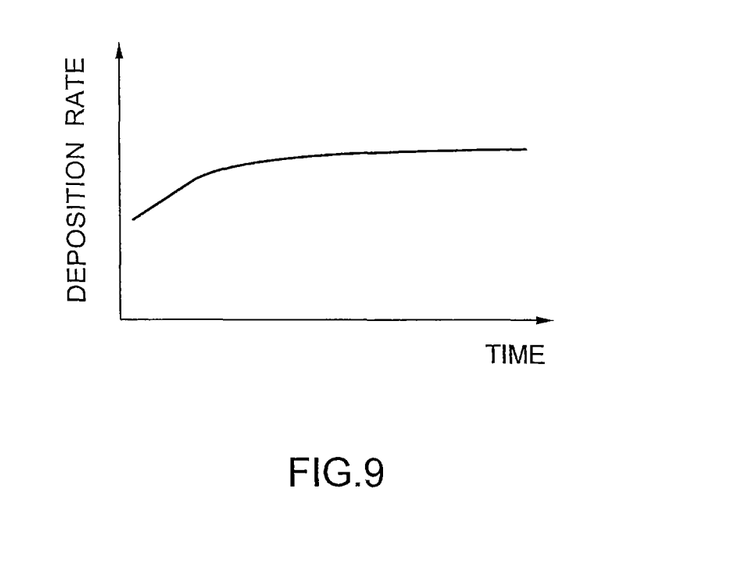
FIG. 9 is a graph illustrating an example of a change in deposition rate with time in a process of forming the deposition film of the first embodiment.

FIG. 9 is a graph illustrating an example of a change in deposition rate with time in a process of forming the deposition film 2 of the first embodiment.

When the deposition film 2 is formed by ALD, the deposition rate of the deposition film 2 increases with time, and then, becomes nearly a fixed value (FIG. 9), in general. Similarly, the deposition rate of the deposition film 2 increases with the flow rate of the second source gas when the flow rate of the second source gas is low, while the deposition rate of the deposition film 2 becomes a fixed value when the flow rate of the second source gas is high. The deposition rate of the deposition film 2 changes of the relative surface area $S/S_0$ of the wafer 1 as described later.

Figure 10A:
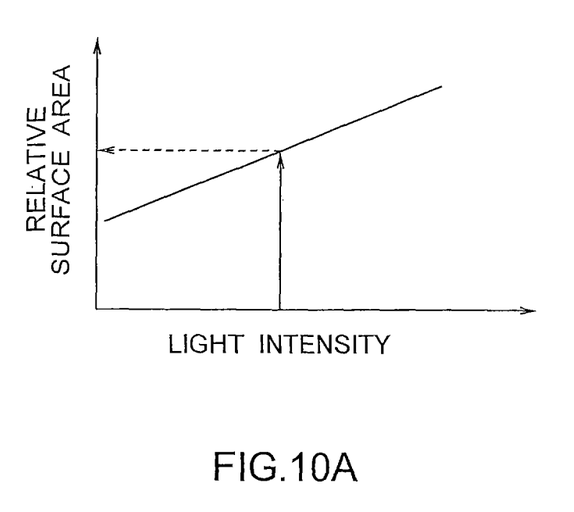
FIGS. 10A and 10B are graphs for describing a semiconductor manufacturing method of a modification of the first embodiment.
Figure 10B:
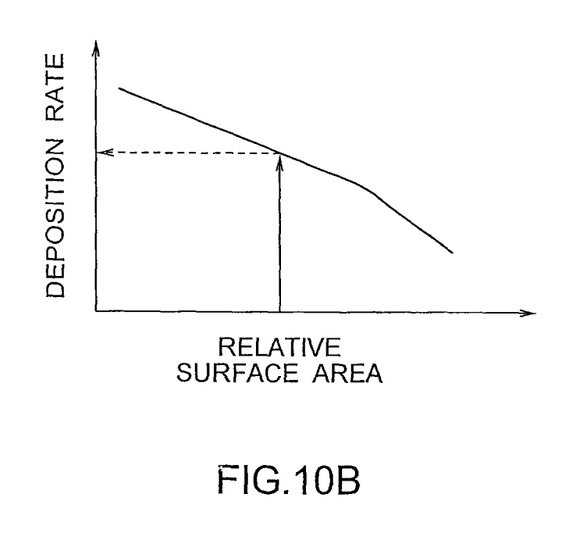

FIGS. 10A and 10B are graphs for describing the semiconductor manufacturing method of the modification of the first embodiment.

The monitor 16 measures a discharge amount of a predetermined substance in an exhaust gas based on an intensity of light from the exhaust gas, for example. In this case, the sequencer 17 calculates the relative surface area $S/S_0$ of the wafer 1 based on the discharge amount of this substance. FIG. 10A illustrates a relationship between the light intensity measured by the monitor 16 and the relative surface area $S/S_0$ calculated by the sequencer 17.

The sequencer 17 of this modification may hold a table or a relational expression indicating the relation in FIG. 10A. In this case, the sequencer 17 can receive the measurement result of the light intensity from the monitor 16, and calculate the relative surface area $S/S_0$ based on the light intensity. The light intensity is an example of a physical amount that relates to the exhaust gas. In this modification, the relative surface area $S/S_0$ can easily be calculated by the calculation method for the relative surface area $S/S_0$ described above.

For example, the sequencer 17 may calculate the relative surface area $S/S_0$ based on an integrated value of the light intensity, or may calculate the relative surface area $S/S_0$ based on the time till the light intensity reaches predetermined intensity. The sequencer 17 of this modification can detect the saturation timing a or the decrease start timing γ illustrated in FIG. 7 based on the light intensity, and calculate the relative surface area $S/S_0$ based on the detected timing.

Similar to the discharge amount of the exhaust gas, the integrated value of the light intensity or the time till the light intensity reaches predetermined intensity increases with the increase in the relative surface area $S/S_0$. The sequencer 17 in the present embodiment may more simply determine the supply amounts of the first and second source gases by using a physical amount that increases with the increase in the relative surface area $S/S_0$ as described above. Specifically, when receiving the physical amount that increases with the increase in the relative surface area $S/S_0$, the sequencer 17 may determine the supply amount of the gas based on this physical amount itself, instead of using the relative surface area $S/S_0$ converted from this physical amount. Specifically, the sequencer 17 may determine the supply amount of the gas indirectly based on the physical amount that increases with the increase in the relative surface area $S/S_0$, or directly based on the physical amount that increases with the increase in the relative surface area $S/S_0$.

FIG. 10B illustrates a relationship between the relative surface area $S/S_0$ of the wafer 1 and the deposition rate of the deposition film 2. In general, the deposition rate of the deposition film 2 decreases with the increase in the relative surface area $S/S_0$ as illustrated in FIG. 10B.

The sequencer 17 of this modification may hold a table or a relational expression indicating the relation in FIG. 10B. In this case, the sequencer 17 may increase a flow rate or a supply time of the second source gas when the deposition rate calculated from the relative surface area $S/S_0$ is small. This control of the present modification can quickly form a uniform deposition film 2, even though the relative surface area $S/S_0$ is large.

As described above, the semiconductor manufacturing system of the present embodiment calculates the relative surface area $S/S_0$ of the wafer 1 based on the discharge amount of the exhaust gas from the ALD apparatus 11 and the like, and controls the supply amount of the source gas to the ALD apparatus 11 based on the relative surface area $S/S_0$ of the wafer. Accordingly, the present embodiment can prevent a lack or a loss of the source gas for the deposition film 2, even though the surface of the wafer 1 is irregular.

The semiconductor manufacturing system of the present embodiment uses the exhaust gas from the ALD apparatus 11 for the calculation of the relative surface area $S/S_0$ of the wafer 1. Therefore, according to the present embodiment, the relative surface area $S/S_0$ can be calculated without extracting the wafer 1 from the ALD apparatus 11.

When the deposition film 2 is formed with a conventional method, a lack or a loss of the source gas for the deposition film 2 is likely to occur with a larger relative surface area $S/S_0$ of the wafer 1. For example, a relative surface area $S/S_0$ of a wafer 1 for a 3D transistor may become 20 or larger. The present embodiment can appropriately control the supply amount of the source gas, even when the deposition film 2 is formed on a large-area wafer 1 with a relative surface area $S/S_0$ of 5 or larger, whereby a lack or a loss of the source gas can be prevented.

When the relative surface area $S/S_0$ of the wafer 1 is large, a large amount of atmospheric components may be adsorbed on the surface of the wafer 1. In this case, a large amount of atmospheric components are desorbed during the purge processes $E_3$, and the monitor 16 may measure a great concentration change in the atmospheric components during the purge processes $E_3$. In such case, the sequencer 17 may calculate the relative surface area $S/S_0$ based on this concentration change. This concentration change is an example of a physical amount concerning the exhaust gas.

When plural wafers, each having a structure same as the wafer 1, are stored in the ALD apparatus 11, a supply amount of a source gas necessary for forming the deposition film 2 on each wafer depends on the number of the wafers. Therefore, in this case, the supply amount of the source gas is desirably controlled based on the relative surface area $S/S_0$ of each wafer and the number of wafers.

Depending on the type of a semiconductor device manufactured from the wafer 1, the ALD apparatus 11 of the present embodiment is used for forming the deposition film 2 by a deposition method other than ALD. For example, the ALD apparatus 11 may be used not only for the adsorption of the precursor (the first source gas) but also in a temperature region in which a gas phase reaction of the precursor occurs. The semiconductor manufacturing method of the present embodiment is applicable to such an ALD apparatus 11 that alternately supplies a precursor and an oxidant (second source gas) and uses the precursor within the above temperature range.

While certain embodiments have been described, these embodiments have been presented by way of example only, and are not intended to limit the scope of the inventions. Indeed, the novel systems and methods described herein may be embodied in a variety of other forms; furthermore, various omissions, substitutions and changes in the form of the systems and methods described herein may be made without departing from the spirit of the inventions. The accompanying claims and their equivalents are intended to cover such forms or modifications as would fall within the scope and spirit of the inventions.

The invention claimed is:
1. A semiconductor manufacturing system comprising:
  a film forming apparatus configured to form a film on a surface of a wafer;
  a gas supply module configured to supply at least a type of source gas for the film into the film forming apparatus;
  a measurement module configured to measure a discharge amount of an exhaust gas from the film forming apparatus; and a controller configured to calculate a surface area or a relative surface area of the wafer based on the discharge amount of the exhaust gas from the film forming apparatus, and to control a supply amount of the source gas to the film forming apparatus based on the surface area or the relative surface area of the wafer.

2. The system of claim 1, wherein the gas supply module supplies, as the source gas, a first source gas to be adsorbed on the surface of the wafer, and a second source gas to react with the first source gas to form the film.

3. The system of claim 2, wherein the controller controls supply amounts of the first and second source gases based on the surface area or the relative surface area of the wafer.

4. The system of claim 2, wherein the measurement module measures, as the discharge amount of the exhaust gas, a discharge amount of the first source gas, a discharge amount of the second source gas, or a discharge amount of a gas generated by the reaction.

5. The system of claim 2, wherein the film forming apparatus alternately executes adsorption processes for adsorbing the first source gas onto the surface of the wafer and reaction processes for allowing the second source gas to react with the first source gas, to form the film.

6. The system of claim 1, wherein the film forming apparatus forms the film by forming a layer included in the film during a first period and forming each layer included in the film during each second period that follow the first period and is shorter than the first period.

7. The system of claim 6, wherein the controller calculates the surface area or the relative surface area of the wafer based on the discharge amount of the exhaust gas measured during the first period.

8. The system of claim 7, wherein
the gas supply module supplies, as the source gas, a first source gas to be absorbed on the surface of the wafer, and a second source gas to react with the first source has to form the film, and
the controller calculates, based on the surface area or the relative surface area of the wafer, a minimum supply amount of the first source gas and a minimum supply amount of the second source gas to be used to form each layer during each second period, and controls the supply amounts of the first and second source gases during each second period based on the minimum supply amounts of the first and second source gases, respectively.

9. The system of claim 8, wherein the controller determines a flow rate and supply time of the first supply gas based on the minimum supply amount of the first supply gas, determines a flow rate and supply time of the second supply gas based on the minimum supply amount of the second supply gas, and controls the supply amounts of the first and second source gases during each second period based on the flow rate and the supply time of the first source gas and the flow rate and the supply time of the second source gas, respectively.

10. The system of claim 1, wherein the measurement module measures the discharge amount of the exhaust gas from the film forming apparatus during the supply of the source gas to the film forming apparatus.

11. The system of claim 1, wherein the measurement module is a spectral photometer or a mass spectrometer.

12. The system of claim 1, wherein the controller controls the supply amount of the source gas to the film forming apparatus based on a number of wafers in the film forming apparatus.

13. A semiconductor manufacturing system comprising:
a film forming apparatus configured to form a film on a surface of a wafer;
a gas supply module configured to supply at least a type of source gas for the film into the film forming apparatus;
a measurement module configured to measure a physical amount that relates to an exhaust gas from the film forming apparatus and increases with an increase of a surface area of the wafer, the measurement module measuring the physical amount based on light from the exhaust gas; and
a controller configured to control a supply amount of the source gas to the film forming apparatus based on the physical amount measured by the measurement module.

* * * * *